(12) United States Patent
Weiblen et al.

(10) Patent No.: US 6,300,169 B1
(45) Date of Patent: Oct. 9, 2001

(54) METHOD FOR MANUFACTURING A PRESSURE SENSOR

(75) Inventors: Kurt Weiblen, Metzingen; Anton Doering, Reutlingen; Juergen Nieder, Reutlingen; Frieder Haag, Reutlingen, all of (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/603,082

(22) Filed: Jun. 26, 2000

(30) Foreign Application Priority Data

Jun. 25, 1999 (DE) .............................. 199 29 026

(51) Int. Cl.[7] .................... H01L 21/44; H01L 21/48; H01L 21/50; B29C 35/00
(52) U.S. Cl. .................. 438/127; 438/126; 438/112; 438/51; 264/328.14; 264/478; 264/327
(58) Field of Search .................. 438/111, 112, 438/123, 124, 125, 126, 51, 127; 264/328.14, 478, 329, 327

(56) References Cited

U.S. PATENT DOCUMENTS

| | | | |
|---|---|---|---|
| 5,368,805 | * 11/1994 | Motai | 264/272.15 |
| 5,672,549 | * 9/1997 | Minami et al. | 437/211 |
| 6,074,195 | * 6/2000 | Belous | 425/549 |
| 6,153,141 | * 11/2000 | Kim et al. | 264/328.14 |

OTHER PUBLICATIONS

Ricken et al., *Advanced Microsystems for Automotive Applications*, '99, p. 126.

* cited by examiner

Primary Examiner—John F. Niebling
Assistant Examiner—Viktor Simkovic
(74) Attorney, Agent, or Firm—Kenyon & Kenyon

(57) ABSTRACT

In a method for manufacturing a pressure sensor, in which a semiconductor pressure sensing element is applied to an assembly segment of a lead grid, the semiconductor pressure sensing element is electrically connected to contact segments of the lead grid. The lead grid having the semiconductor pressure sensing element is inserted into an injection molding die, and then the semiconductor pressure sensing element, in the injection molding die, is surrounded by a housing made of injection molding compound. A structure is present in the injection molding die through which a pressure feed for the semiconductor pressure sensing element is left free from the jacket of injection molding compound. A stamp is arranged in the injection molding die so as to be separated by a gap from the side of the assembly segment that is facing away from the semiconductor pressure sensing element or from the side of the semiconductor pressure sensing element that is facing away from the assembly segment. As a result of a change in the temperature of the stamp relative to the temperature of the liquefied injection molding compound, a reduction in the flow capacity of the injection molding compound in the area of the stamp is brought about and, as a result, at least a complete penetration of the injection molding compound into the gap is avoided.

4 Claims, 3 Drawing Sheets

METHOD FOR MANUFACTURING A PRESSURE SENSOR

FIELD OF THE INVENTION

The present invention relates to a method for manufacturing a pressure sensor.

BACKGROUND OF THE INVENTION

A method for manufacturing a pressure sensor is described, by way of example, from the publication "Advanced Microsystems for Automotive Applications '99, D. E. Ricken, W. Gessner, p. 126." In that method, a semiconductor pressure sensing element, which has, applied on a base, a semiconductor chip having a pressure membrane, is applied onto a lead grid, a so-called lead frame. A planar segment of the lead grid, a so-called die pad, functions in this context as assembly segment of the semiconductor pressure sensing element. Subsequently, the semiconductor chip is connected to contact segments of the lead grid via bonding wires. In a transfer molding process referred to as "transfer molding," which is also referred to as transfer forming, the semiconductor pressure sensing element is then embedded in a housing made of injection molding compound (mold compound). The pressure feed of the sensor, in this context, can issue from the upper side of the semiconductor pressure sensing element or through a pressure channel connected to the lower side of the semiconductor chip and provided in the base and the assembly segment. In carrying out the method, care should be taken in the injection molding of the semiconductor pressure sensing element that a pressure feed in the housing is kept free of the injection molding compound. In the method, this occurs through the use of a tool part, which is pressed, in the injection molding die, either against the upper side of the semiconductor pressure sensing element or against the assembly segment, depending on whether the pressure feed is to proceed from the side of the semiconductor pressure sensing element facing away from the lead grid or from the side facing the lead grid. After the injection molding process, the tool part is removed, as a result of which a recess remains in the injection molding compound, which functions as the pressure feed.

In the method discussed above, it is disadvantageous that the stamp must be pressed against the semiconductor sensor or the assembly segment of the lead grid. In response to the pressing of the stamp on the semiconductor pressure sensing element, the membrane of the semiconductor chip can be damaged. In response to the pressing of the stamp against the assembly segment of the lead grid furnished with a pressure channel, the assembly segment can move relative to the contact segments laid down in the injection molding die, so that between the assembly segment and the stamp a gap arises into which injection molding compound can penetrate.

SUMMARY OF THE INVENTION

As a result of the method according to the present invention, the known disadvantages are avoided. In the method according to the present invention, the stamp does not reach or touch the semiconductor pressure sensing element or the assembly segment, but rather, in the injection molding die, is separated by a gap from the semiconductor pressure sensing element or the assembly segment. By changing the temperature of the stamp relative to the temperature of the liquefied injection molding compound, the flow properties of the injection molding compound are reduced and, in the area of the stamp, as a result, at least a complete penetration is avoided of the injection molding compound into the gap between the stamp and the semiconductor pressure sensing element or into the gap between the stamp and the assembly segment. In this context, use is made of the temperature dependence of the flow properties of the injection molding compound. In the injection molding of the semiconductor pressure sensing element, injection molding compounds are used whose flow property is markedly dependent on the temperature. By altering the temperature of the stamp, the fluidity of the injection molding compound is reduced in the area of the stamp, so that the injection molding compound does not penetrate into the gap, or does so only slightly. As a result, a pressure feed in the housing can advantageously be kept free of injection molding compound without the membrane of the semiconductor pressure sensing element or the assembly segment, in the injection molding die, being touched by the stamp.

In a first exemplary embodiment, the viscosity of the injection molding compound in the area of the stamp is increased by cooling the stamp such that the injection molding compound does not penetrate into the gap, or at least does not do so completely.

In a second exemplary embodiment of the method, by heating the stamp, the injection molding compound is wetted and cured more rapidly in the area of the stamp, so that the injection molding compound can only slightly penetrate into the gap, or not all.

DETAILED DESCRIPTION

Figure 1:
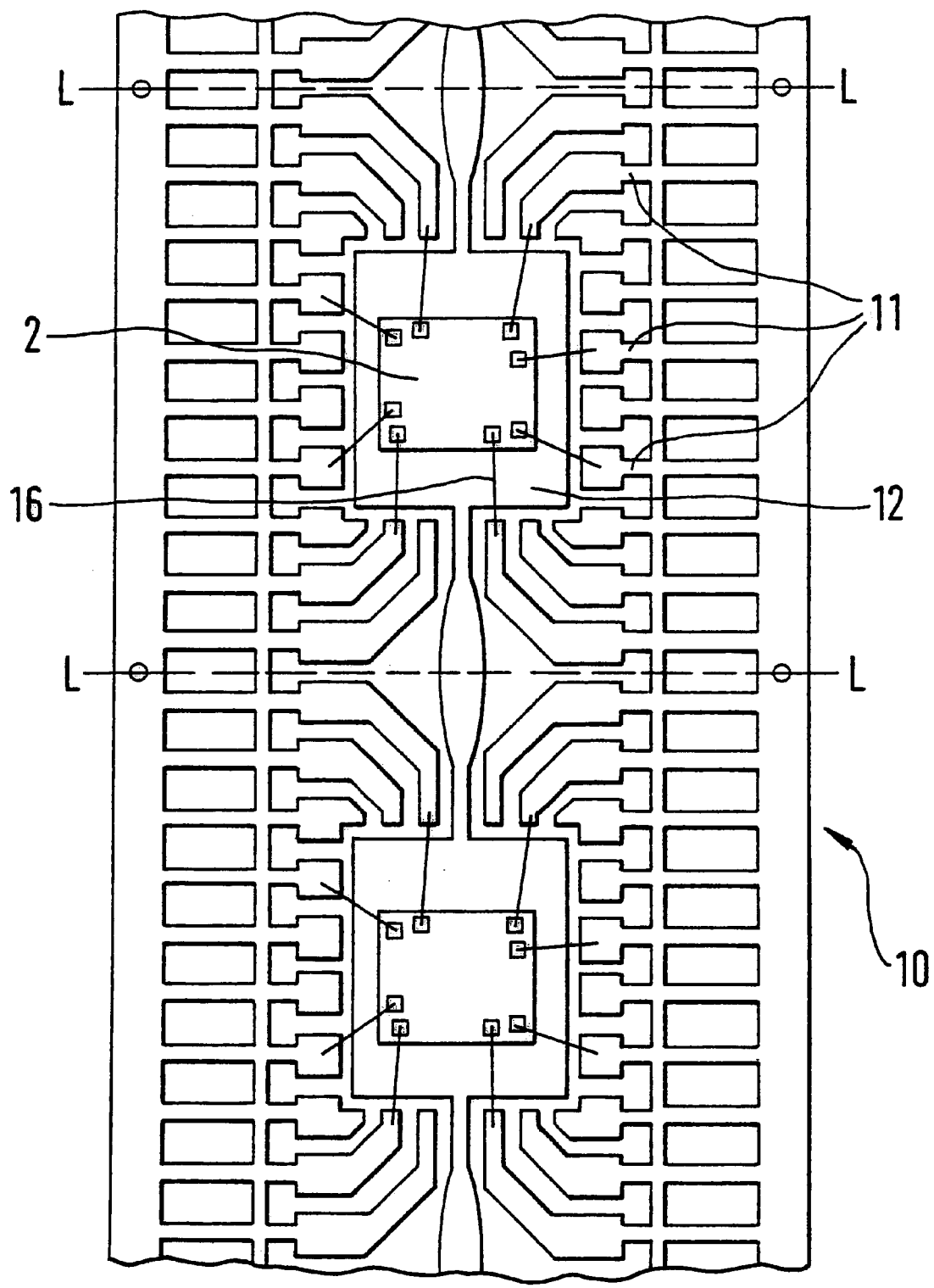
FIG. 1 depicts a top view of a lead grid before separation and before insertion into the injection molding die.
Figure 2:
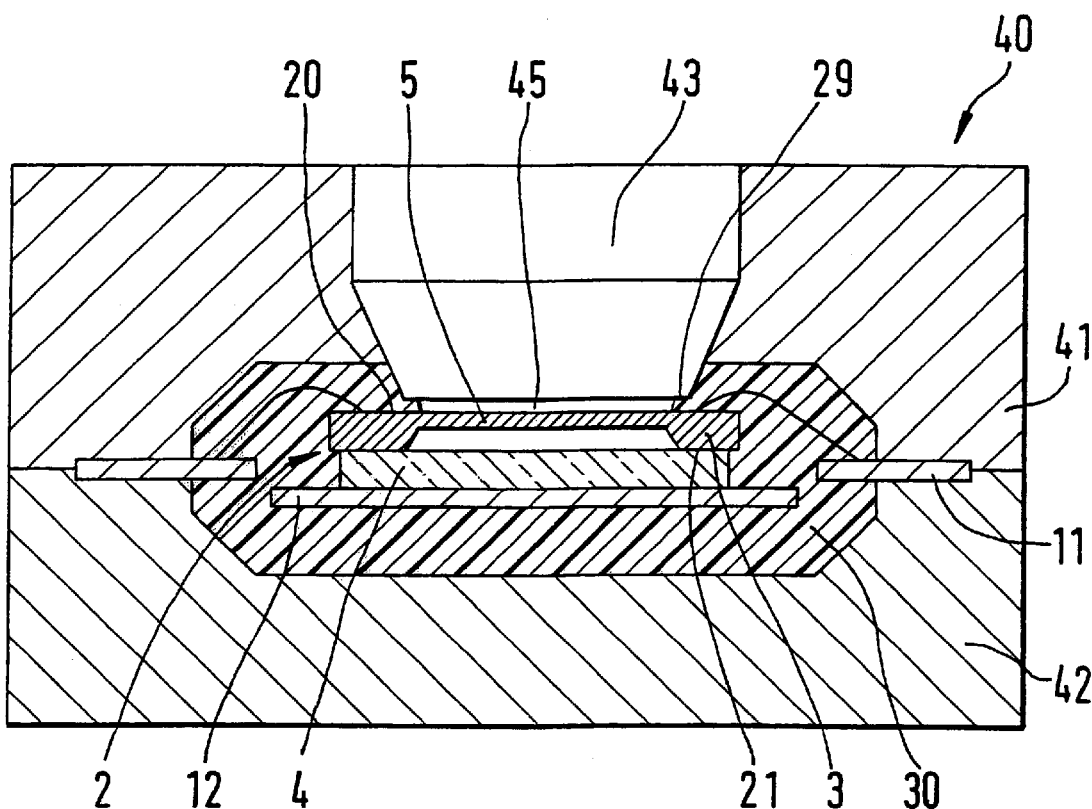
FIG. 2 depicts a cross-section of the pressure sensor in the injection molding die.
Figure 3:
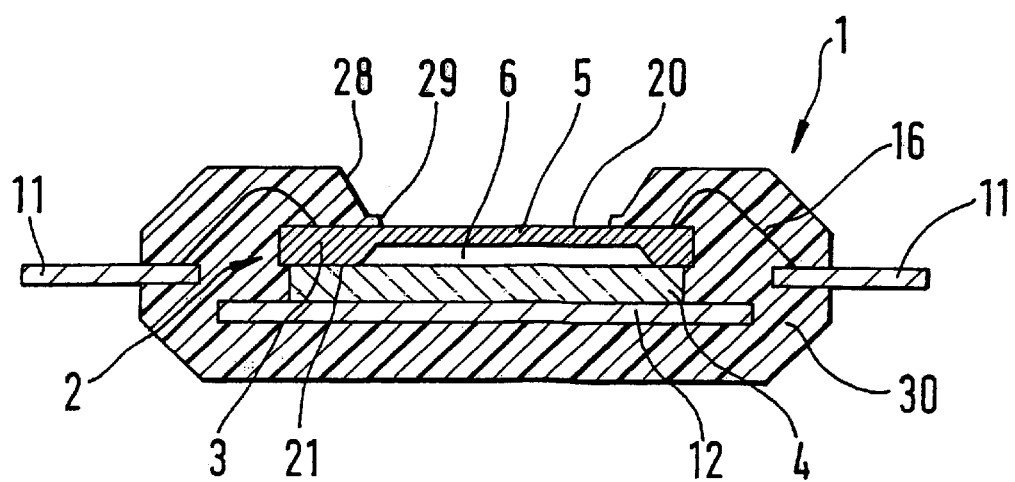
FIG. 3 depicts the finished pressure sensor from FIG. 1.

A first exemplary embodiment of the method according to the present invention is explained on the basis of FIGS. 1 through 3. FIG. 1 depicts a lead grid 10, a so-called lead frame. Strip-shaped lead grid 10 can be manufactured, by way of example, through stamping and bending from one sheet metal strip or in a different shape, and, in the longitudinal direction of the strip, it has a plurality of uniformly shaped segments, which can be separated along lines L—L. In this manner, a manufacturing process is possible that is advantageous. The manufacturing of the pressure sensors takes place preferably in an automated assembly line process. Each area of the lead grid between the separating lines L—L has a planar assembly segment 12 for the applying of a semiconductor pressure sensing element 2. As can be seen in FIG. 2 and FIG. 3, semiconductor pressure sensing element 2 has a semiconductor chip 3, for example, a silicon chip, in whose lower side 21 a depression is introduced. One segment of semiconductor chip 3 having decreased material thickness above depression 6 constitutes deformable membrane 5. Semiconductor chip 3, at lower side 21, is applied to a base 4, for example, a glass base or a plastic base. Depression 6 is sealed hermetically tight by base 4 and constitutes a reference space for the pressure measurement. On upper side 20 of semiconductor chip 3 an undepicted evaluation element is arranged in a known manner, using which a deformation of membrane 5 can be verified. The evaluation element, by way of example, can be piezoresistive elements in the area of the membrane, using which mechanical stresses in membrane 5 can be verified. After the application of semiconductor pressure sensing element 2 onto segment 12 of lead grid 10, semiconductor chip 3 is electrically connected to contact segments 11 of lead grid 10 via bonding wires 16, as is shown in FIG. 1. Subsequently, the contact segments can be separated through cutting or stamping the lateral crossbars of the lead grid and the connecting bars of contact segments 11. Assembly segment 12, influenced by the elastic tensional force of bonding wires 16, can now be moved relative to contact segments 11.

As is shown in FIG. 2, a lead grid 10 that is furnished with a semiconductor pressure sensing element 3 is inserted into an injection molding die 40. Injection molding die 40 can be configured, for example, in a two-part form, having an upper part 41 and a lower part 42, contact segments 11 being clamped between upper part 41 and the lower part. Injection molding die 40 has a stamp 43. As depicted in FIG. 2, the stamp is arranged in the injection molding die over membrane 5 of semiconductor chip 3, so that the stamp surface facing upper side 20 is separated by a gap 45 from upper side 20 of semiconductor chip 3. The width of gap 45 can be, for example, 0.5 mm or less. Then semiconductor pressure sensing element 2 is embedded into a housing 30 made of injection molding compound in an injection molding process known as transfer forming or "transfer molding." In this process, the injection molding compound, for example, a duroplast, an epoxide, or a thermoplast, is first liquefied and then injected or pressed into the chamber having the semiconductor pressure sensing element.

In a first example of the method according to the present invention, by cooling the stamp, the temperature of the stamp is lowered to significantly below the temperature of the liquefied injection molding compound. For this purpose, the stamp is connected to a cooling device. As a result, the viscosity of the injection molding compound is increased in the vicinity of the stamp and its flow capacity is reduced. The injection molding compound located in the immediate vicinity of stamp 43, due to its reduced flow capacity, cannot penetrate into gap 45, or does so only slightly. In any event, the injection molding compound penetrates into gap 45 in an annular edge area 29, but it does not reach membrane 5. After the injection molding compound is completely wetted, the tool parts are removed from the pressure sensor. Finished pressure sensor 1, as is shown in FIG. 3, now has a recess 28 in housing 30, the recess forming a pressure feed for membrane 5 of semiconductor chip 3. Contact segments 11 can finally be bent into the shape of contact pins.

In a second example of the method according to the present invention, stamp 43 is heated high above the temperature of the liquid injection molding compound. The stamp, for this purpose, is connected to a heating device. As the injection molding compound, a duroplast is used, which is initially liquefied as a result of the pressure and temperature increase and is injected, in the injection molding die, around the semiconductor pressure sensing element. Then the liquid duroplast is wetted and cured, forming housing 30. In this context, the wetting is temperature-dependent. The higher the temperature, the more rapidly is the injection molding compound wetted. By heating the stamp above the temperature of the liquefied duroplast, it is achieved that the duroplast located immediately at the edge of gap 45 is wetted more rapidly and becomes hard faster than in the other areas of the injection molding die. As a result, a ring 29 forms very rapidly from the cured duroplast, which functions as a barrier and prevents further penetration of still liquid duroplast into gap 45.

Figure 4:
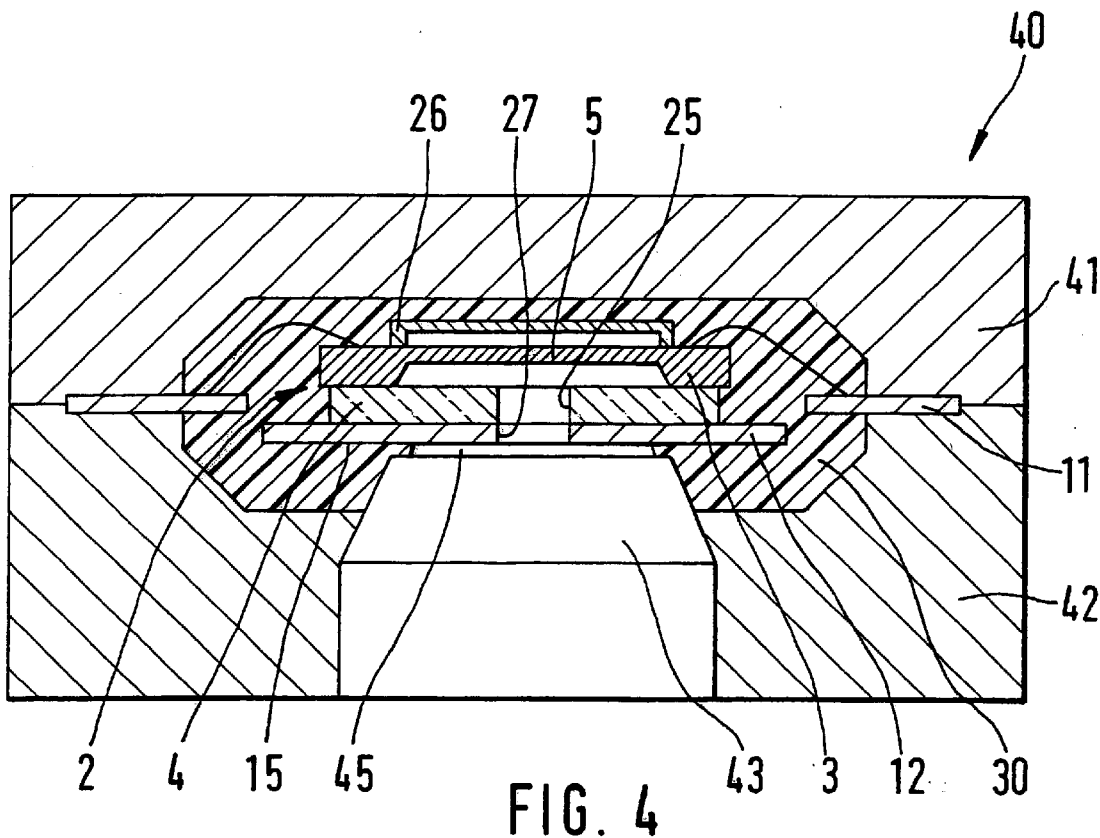
FIG. 4 depicts a cross-section of a pressure sensor in the injection molding die for a further exemplary embodiment of the method according to the present invention.
Figure 5:
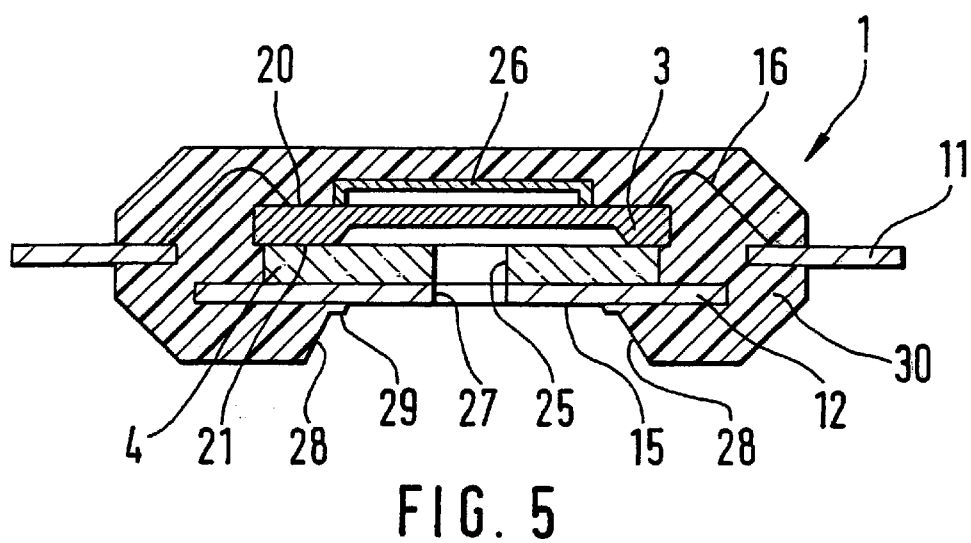
FIG. 5 shows the finished manufactured pressure sensor of FIG. 3.

In FIGS. 4 and 5, a further exemplary embodiment of the present invention is depicted, in which a cutout 25 connected to depression 6 is introduced in base 4 of semiconductor pressure sensing element 2. Beneath base 4, a further cutout 27 is provided in assembly segment 12, which is aligned with cutout 25. As a result of cutout 27 of assembly segment 12, cutout 25 of base 4, and depression 6, a pressure channel is formed, through which membrane 5 of semiconductor chip 3 can be acted upon by a pressure. Upper side 20 of semiconductor chip 3, in this example, is covered by a cap or a cover 26, a hollow space being formed between the inner side of cover 26 and the upper side 20 of semiconductor chip 3, the hollow space functioning as a reference space for the pressure measurement. Since, in this example, the pressure feed is effected via cutout 27 of assembly segment 12, stamp 43 is here arranged through a gap 45 with respect to side 15 of assembly segment 12 that is facing away from semiconductor pressure sensing element 2, and overlaps cutout 27. For the rest, the process is conducted as described above, the same parts being furnished with the same reference numerals. As depicted in FIG. 5, finished pressure sensor 1 has a recess 28, through which the pressure channel formed from cutout 27, cutout 25, and depression 6, can be accessed freely from the outside.

What is claimed is:

1. A method for manufacturing a pressure sensor, comprising the steps of:

applying a semiconductor pressure sensing element to an assembly segment of a lead grid;

electrically connecting the semiconductor pressure sensing element to contact segments of the lead grid;

inserting the lead grid having the semiconductor pressure sensing element into an injection molding die;

surrounding the semiconductor pressure sensing element in the injection molding die with a housing made of an injection molding compound;

causing a structure present in the injection molding die to leave open from a jacket of the injection molding compound a pressure feed for the semiconductor pressure sensing element, the structure including a stamp;

arranging the stamp in the injection molding die so as to be separated by a gap from one of a side of the assembly segment that is facing away from the semiconductor pressure sensing element and a side of the semiconductor pressure sensing element that is facing away from the assembly segment; and reducing a flow capacity of the injection molding compound in an area of the stamp by changing a temperature of the stamp relative to a temperature of the injection molding compound when liquefied, whereby at least a complete penetration of the injection molding compound into the gap is avoided.

2. The method according to claim 1, further comprising the step of:

cooling the stamp to increase a viscosity of the injection molding compound such that the injection molding compound at least cannot completely penetrate into the gap.

3. The method according to claim 1, further comprising the step of:

heating the stamp to bring about a more rapid wetting and curing of the injection molding compound in an area of the stamp and to prevent the injection molding compound at least from completely penetrating into the gap.

4. The method according to claim 1, wherein:
the injection molding compound is a duroplast.

\* \* \* \* \*